(12) United States Patent
Kanzler et al.

(10) Patent No.: US 6,776,828 B2
(45) Date of Patent: Aug. 17, 2004

(54) PLATING COMPOSITION

(75) Inventors: Miriana Kanzler, Bayshore, NY (US); Michael P. Toben, Smithtown, NY (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/279,673

(22) Filed: Oct. 24, 2002

(65) Prior Publication Data

US 2004/0009292 A1 Jan. 15, 2004

Related U.S. Application Data

(60) Provisional application No. 60/350,084, filed on Oct. 25, 2001, and provisional application No. 60/339,659, filed on Dec. 12, 2001.

(51) Int. Cl.$^7$ .............................................. C23C 18/42
(52) U.S. Cl. ...................... 106/1.23; 106/1.26; 427/98; 427/304
(58) Field of Search ............................. 106/1.23, 1.26; 427/98, 304

(56) References Cited

U.S. PATENT DOCUMENTS

| | | | | |
|---|---|---|---|---|
| 3,753,874 A | | 8/1973 | Zimmerman et al. | 205/251 |
| 3,992,211 A | * | 11/1976 | Skoll | 106/1.11 |
| 4,481,035 A | | 11/1984 | Andrascek et al. | 106/1.23 |
| 4,804,559 A | | 2/1989 | Ushio et al. | 427/96 |
| 5,198,273 A | * | 3/1993 | Ando et al. | 427/437 |
| 5,202,151 A | | 4/1993 | Ushio et al. | 427/98 |
| 5,232,492 A | | 8/1993 | Krulik et al. | 106/1.23 |
| 5,302,278 A | * | 4/1994 | Nobel et al. | 205/296 |
| 5,318,621 A | | 6/1994 | Krulik et al. | 106/1.23 |
| 5,364,460 A | | 11/1994 | Morimoto et al. | 106/1.23 |
| 5,470,381 A | | 11/1995 | Kato et al. | 106/1.23 |
| 5,803,957 A | | 9/1998 | Murakami et al. | 106/1.13 |
| 5,935,306 A | | 8/1999 | Reed | 106/1.23 |
| 6,251,249 B1 | * | 6/2001 | Chevalier et al. | 205/80 |
| 2004/0018308 A1 | * | 1/2004 | Kanzler | 427/304 |

FOREIGN PATENT DOCUMENTS

| | | |
|---|---|---|
| JP | 8-253872 | 10/1996 |
| JP | 9-157859 | 6/1997 |
| JP | 9-287077 | 11/1997 |
| JP | 11-12753 | 1/1999 |
| JP | 2000-17448 | 1/2000 |
| JP | 2000-345359 | 12/2000 |
| WO | WO 99/18254 | 4/1999 |

* cited by examiner

*Primary Examiner*—Helene Klemanski
(74) *Attorney, Agent, or Firm*—S. Matthew Cairns

(57) ABSTRACT

Disclosed are compositions suitable for electroless gold plating including one or more water soluble gold compounds, one or more gold complexing agents, one or more organic stabilizer compounds, and one or more carboxylic acid uniformity enhancers. Methods of plating and methods of manufacturing electronic devices using these compositions are also provided.

20 Claims, No Drawings

PLATING COMPOSITION

CROSS-REFERENCE TO RELATED APPLICATIONS

This application claims the benefit under 35 U.S.C. § 119(e) of U.S. Provisional Application Nos. 60/350,084 filed Oct. 25, 2001 and 60/339,659 filed Dec. 12, 2001, the entire contents of which applications are incorporated herein by reference.

BACKGROUND OF THE INVENTION

The present invention relates generally to the field of electroless metal plating. In particular, the present invention relates to the field of electroless gold plating.

Immersion or displacement plating is an electroless plating process, but is given a separate classification in the art. In immersion plating, deposition is by displacement of an elemental metal from a substrate by metal ions in a plating solution. In electroless plating deposition takes place primarily by autocatalytic reduction of metal ions from solution. Such electroless plating requires the presence of a reducing agent.

Immersion plating does not employ an external electric current but rather is an electrochemical displacement reaction which is driven by the position of the substrate metal in the electromotive series relative to the metal to be deposited from solution. Plating occurs when the dissolved metal ions in a plating bath are displaced by a more active (less noble) metal that is contacted with the plating bath.

In the manufacture of printed wiring boards, solderable finishes are typically applied to printed wiring board substrates having pads and/or through holes exposed through a mask, such as a soldermask. Such solderable finishes are often applied by immersion plating as electroless plating can also deposit metal on the surface of the mask, which is undesirable. As an immersion plating reaction is driven by the difference in electrochemical potentials, plating will only occur at areas of exposed metal. For example, U.S. Pat. No. 5,143,544 (Iantosca) discloses a solution for immersion plating a tin-lead alloy suitable as a solderable finish on a printed wiring board substrate. However, there is a growing demand for more environmentally acceptable alternatives to lead for use in printed wiring board manufacture. Thus, the use of lead and lead alloys in electronic components faces an uncertain future. See, for example, U.S. Pat. No. 5,536,908 (Etchells et al.).

Silver is a more environmentally acceptable alternative to lead and has been suggested for use as a solderable finish. As discussed above, the preferred method of depositing such a solderable finish is by immersion plating. For example, U.S. Pat. No. 5,955,141 (Souter et al.) discloses certain immersion silver plating baths suitable for depositing a layer of silver on a printed wiring board. Silver has many drawbacks, such as poor adhesion of immersion silver deposits and silver's tendency to tarnish, thus requiring the use of anti-tarnish coatings.

Gold has long been used in the electronics industry as a metal for contact surfaces because of its low electrical resistivity and its inertness to attack by corrosive substances. Such gold deposits have typically been plated using electroless or immersion gold plating baths. In particular, gold has long been used over a nickel undercoat to provide a solderable finish. Typically, the nickel undercoat is electrolessly applied while the gold is immersion deposited. Such processes are referred to as electroless-nickel-immersion-gold or "ENIG."

One conventional form of electroless gold plating bath is thiosulfate ion based, stabilized with sulfite ions. Such baths are typically unstable when operated at a pH of 6 or below as sulfur dioxide is liberated from the bath under these pH conditions. It is known that the thiosulfate ion decomposes in acid solution to give elemental sulfur and sulfite ions. When an aqueous solution of sodium thiosulfate is adjusted to a pH of about 4 to 5, the solution will turn cloudy due to the formation of elemental sulfur. However, if sodium sulfite is also added to the above solution, elemental sulfur will not form and the solution will be stable and clear. Sodium sulfite has, therefore, been used in prior art metal plating solutions and sodium thiosulfate to stabilize the solution. The problem with using sodium sulfite, however, is that the sulfite ion itself is not stable in mildly acidic solutions, such that sulfur dioxide is slowly formed and liberated from the solution. The more acidic the solution, the faster the rate of sulfur dioxide formation will be. This leads to high consumption of sodium sulfite and instability of the metal thiosulfate complex in acidic solutions.

U.S. Pat. No. 5,302,278 (Nobel et al.) discloses metal electroplating solutions, including gold electroplating solutions, containing thiosulfate where the thiosulfate is stabilized by an organic sulfinic acid salt. Neither electroless nor immersion plating solutions are disclosed in this patent.

Electroless gold plating baths contain a reducing agent. Typical reducing agents are thiourea and alkyl thiourea derivatives, enol-containing compounds such as ascorbic acid (see U.S. Pat. No. 4,481,035 to Andrascek et al.), and boron containing compounds such as alkylboranes and borohydrides. These conventional plating baths have certain drawbacks. For example, baths containing thiourea as the reducing agent must be heated to about 80° to 90° C. in order to achieve acceptable deposition rates. Such temperatures are too high for use with some electronics packaging materials. Also, at such temperatures the plating solutions can become unstable and spontaneously form fine particles of gold throughout the solution instead of producing gold deposits only on the desired substrate. When boron containing compounds are used as the reducing agent, such compounds first undergo a hydrolysis reaction whose rate increases with temperature. Much of the boron containing reducing agent is consumed in undesired side reactions making control of its concentration quite difficult.

International patent application WO 99/18254 (Scheel et al.) discloses a solution for electroless gold plating which may contain certain reducing agents, such as oxalic acid. This patent application fails to disclose sulfinic acid or sulfinic acid salts as stabilizers.

Immersion gold plating baths avoid many of the above reducing agent-derived drawbacks. However, such immersion plating baths typically require high plating temperatures, such as about 70° C. or greater, for proper operation. Such high temperatures are often incompatible with some electronics packaging materials.

Thus, there is a need for electroless gold plating solutions that are stable and that work at lower temperatures than conventional plating solutions.

SUMMARY OF THE INVENTION

In one aspect, the present invention provides an electroless gold plating composition including: a) one or more water soluble gold compounds; b) one or more gold complexing agents; c) one or more organic stabilizer compounds of the formula R—SO$_2$—Y wherein R is (C$_1$–C$_{18}$)alkyl, aryl, or heteroaryl and Y is hydrogen or a monovalent cation; and d) one or more uniformity enhancers.

In another aspect, the present invention provides method of electrolessly depositing gold on a substrate including the step of contacting a substrate with the composition described above.

The present invention further provides a method for depositing gold on a metal that is less electropositive than gold including contacting a substrate containing a metal that is less electropositive than gold with the composition described above.

In a still further aspect, the present invention provides a method of manufacturing an electronic device including depositing a gold layer including the step of contacting an electronic device substrate with a composition including: a) one or more water soluble gold compounds; b) one or more gold complexing agents; c) one or more organic stabilizer compounds of the formula R—$SO_2$—Y wherein R is ($C_1$-$C_{18}$)alkyl, aryl, or heteroaryl and Y is hydrogen or a monovalent cation; and d) and one or more uniformity enhancers; for a period of time sufficient to deposit the desired gold layer.

DETAILED DESCRIPTION OF THE INVENTION

As used throughout this specification, the following abbreviations shall have the following meanings, unless the context clearly indicates otherwise: ° C.=degrees Centigrade; ° F.=degrees Fahrenheit; g=gram; L=liter; mN=milliNewtons; mm=millimeter; $\mu$in=microinches; and $\mu$m=microns=micrometers. The terms "depositing" and "plating" are used interchangeably throughout this specification. "Alkyl" refers to linear, branched and cyclic alkyl. "Halide" refers to fluoride, chloride, bromide and iodide. Likewise, "halo" refers to fluoro, chloro, bromo and iodo. Unless otherwise indicated, aromatic compounds having two or more substituents include ortho-, meta- and para-substitution. All percentages are by weight, unless otherwise noted. All numerical ranges are inclusive and combinable in any order, except where it is obvious that such numerical ranges are constrained to add up to 100%.

The present invention provides an electroless gold plating composition including: a) one or more water soluble gold compounds; b) one or more gold complexing agents; c) one or more organic stabilizer compounds of the formula R—$SO_2$—Y wherein R is ($C_1$-$C_{18}$)alkyl, aryl, ($C_1$-$C_6$) alkylaryl, or heteroaryl and Y is hydrogen or a monovalent cation; and d) one or more uniformity enhancers.

Any of a wide variety of water soluble gold compounds that provide gold (I) to the composition may be used in the present invention. Suitable gold compounds include, but are not limited to, alkali gold thiosulfate compounds such as trisodium gold thiosulfate and tripotassium gold thiosulfate. It is preferred that the gold compound is trisodium gold thiosulfate. It will be appreciated that a variety of other water soluble gold compounds may be employed in the present compositions, such as alkali gold sulfite compounds such as sodium gold sulfite and potassium gold sulfite, ammonium gold sulfite, gold halides such as gold chloride, alkali gold cyanide compounds, such as sodium gold cyanide and potassium gold cyanide, and ammonium gold cyanide. However, it is preferred that the present compositions are substantially free of cyanide ions and sulfite ions. By "substantially free" it is meant that the present compositions contain less than 0.05 g/L of such ions. It is further preferred that the present compositions are free of cyanide ions and sulfite ions.

The total amount of the one or more water soluble gold compounds is typically from 0.1 to 60 g/L. Preferably, the gold compounds are present in an amount of 0.5 to 15 g/L, and more preferably 0.5 to 5 g/L. Such water soluble gold compounds are generally commercially available from a variety of suppliers or may be prepared by methods well known in the art.

A wide variety of gold complexing agents may be used in the present invention. Suitable gold complexing agents include, but are not limited to, thiosulfuric acid, thiosulfate salts such as sodium thiosulfate, potassium thiosulfate, and ammonium thiosulfate, ethylenediamine tetraacetic acid and its salts, nitrilotriacetic acid, and the like. Thiosulfuric acid and thiosulfate salts are preferred. Most preferred is sodium thiosulfate.

When thiosulfate ion is used, it can be supplied in any solution soluble form, such as an alkali thiosulfate (e.g., sodium or potassium) or ammonium thiosulfate, with sodium thiosulfate pentahydrate being the most economical and readily available source.

Such one or more complexing agents are typically present in a total amount of 0.1 to 150 g/L, and preferably from 1 to 100 g/L. A more preferred amount of complexing agent is from 5 to 75 g/L, and still more preferably from 10 to 60 g/L. The one or more complexing agents are generally commercially available or may be prepared from by methods well known in the art.

The one or more organic stabilizer compounds useful in the present invention have the formula R—$SO_2$—Y wherein R is ($C_1$-$C_{18}$)alkyl, aryl, or heteroaryl and Y is hydrogen or a monovalent cation. Suitable monovalent cations for Y are alkali metals, such as sodium and potassium. It is preferred that Y is hydrogen. Exemplary alkyl groups for R include, but are not limited to, methyl, ethyl, n-propyl, iso-propyl, n-butyl, tert-butyl, iso-butyl, n-pentyl, neo-pentyl, hexyl, octyl and decyl. Typical aryl groups are those containing 5 to 14 atoms in the aromatic rings. Suitable aryl groups include, but are not limited to: phenyl; ($C_1$-$C_6$)alkylaryl such as tolyl and xylyl; naphthyl; and bisphenol A. Suitable heteroaryl groups include, but are not limited to, furanyl, pyridyl, thiophenyl, and the like. It is preferred that R is an aryl group, and more preferably phenyl.

It will be appreciated by those skilled in the art that substituted ($C_1$-$C_{18}$)alkyl, aryl, or heteroaryl are within the scope of this invention. By "substituted ($C_1$-$C_{18}$)alkyl, aryl, or heteroaryl", it is meant that one or more hydrogens on the ($C_1$-$C_{18}$)alkyl, aryl, or heteroaryl group is replaced by one or more substituents groups. Suitable substituents groups include, but are not limited to, halo, hydroxy, ($C_1$-$C_6$) alkoxy, carb($C_1$-$C_6$)alkoxy, nitro, thio, ($C_1$-$C_6$)alkylthio, and the like.

In general, the one or more organic stabilizer compounds are used in an amount of at least 0.5 g/L, preferably at least 1 g/L. The practical upper limit of the amount of the one or more organic stabilizer compounds is the saturation limit of such compounds in the composition. Preferably, the one or more organic stabilizer compounds are used in an amount of 2 g/L to 25 g/L and more preferably from 3 to 15 g/L. A particularly suitable amount of organic stabilizer compound is 3 to 10 g/L. Such organic stabilizer compounds are generally commercially available or may be prepared by methods well known in the art.

While not intending to be bound by theory, it is believed that the present organic stabilizer compounds stabilize the electroless gold plating compositions, particularly when thiosulfate ion is used, under mildly acidic conditions, such that the solution does not break down on standing and does not liberate any appreciable amounts of sulfur dioxide in the case of thiosulfate ion.

One or more uniformity enhancers are added to the present compositions. Such uniformity enhancers are typically organic carboxylic acids capable of providing chelation. While not wishing to be bound by theory, such uniformity enhancers may additionally act as mild reducing agents. These uniformity enhancers have been found to provide a more uniform gold deposit than that provided by compositions that do not contain such compounds. Suitable uniformity enhancers include polycarboxylic acids such as di- and tri-carboxylic acid compounds, hydroxy-substituted carboxylic acid compounds, and the like. It is preferred that the uniformity enhancer is a di-carboxylic acid. Exemplary uniformity enhancers include, but are not limited to, oxalic acid, ascorbic acid, citric acid, malic acid, glycolic acid, malonic acid, lactic acid, oxalactic acid and tartaric acid. Other suitable uniformity enhancers include phthalic acid, adipic acid, succinic acid and glutaric acid. Preferred uniformity enhancers are oxalic acid, malonic acid, ascorbic acid, and citric acid. Oxalic acid is the most preferred uniformity enhancer.

In general, the one or more uniformity enhancers are used in an amount of 0.1 to 50 g/L, and preferably from 1 to 15 g/L. A particularly suitable amount of uniformity enhancer is from 2 to 8 g/L.

Particularly useful compositions of the present invention include a) 0.5 to 15 g/L of one or more alkali metal gold thiosulfate compounds; b) 1 to 100 g/L of one or more gold complexing agents selected from the group consisting of thiosulfuric acid or an alkali metal thiosulfate salt; c) 2 g/L to 25 g/L of one or more organic stabilizer compounds of the formula R—SO$_2$—Y wherein R is (C$_1$–C$_{18}$)alkyl, aryl, or heteroaryl and Y is hydrogen or a monovalent cation; and d) 1 to 15 g/L of oxalic acid.

The present compositions may further include a pH regulating compound. Any pH regulating compound may be used provided that it does not adversely affect the stability or performance of the composition. Suitable pH regulating compounds include phosphates such as dihydrogen potassium phosphate monohydrogen dipotassium phosphate, tripotassium phosphate, boric acid, and the like. The amount of such pH regulating compound used depends upon the desired pH to be maintained and the specific pH regulating compound selected. For example, dihydrogen potassium phosphate is typically used in an amount of 1 to 50 g/L, and preferably from 5 to 25 g/L. In general, the present compositions are maintained at a pH 3 to 9, preferably 4 to 8 and preferably from 5 to 7.5.

The compositions generally include water. Any grade of water is suitable, but deionized is preferred.

Gold plating compositions of the present invention may optionally contain one or more other additives, such as surfactants. Anionic and nonionic surfactants are the preferred surfactants, and anionic surfactants are more preferred. Suitable anionic surfactants include phosphate esters such as phosphate esters of aliphatic alcohols including phosphate esters of glycerides, and preferably phosphate esters of long chain aliphatic alcohols. Suitable anionic phosphate ester surfactants include those sold under the RHODAFAC and EMPHOS trademarks, available from Rhodia and Crompton Corporation, respectively. Such surfactants are typically used in an amount of 0.1 to 2 g/L.

The present compositions may be prepared by combining the above components in any order. It is preferred that when gold chloride is used, it is added to the compositions after the gold complexing agents, organic stabilizer compounds and uniformity enhancers are added to the composition. Preferably, the pH of the composition is maintained at $\geq 5$ during the addition of the gold chloride. The pH may be maintained, for example, by the addition of hydroxide, such as potassium hydroxide.

In general, the present gold plating baths are heated during use, typically from 25° to 65° C. Preferably, the present baths are heated from 30° to 60°, and more preferably from 45° to 60° C. Temperatures higher than about 65° C. may be employed, however, one of the advantages of the present compositions is their ability to deposit gold uniformly at lower temperatures than conventional electroless gold plating processes.

While not wishing to be bound by theory, it is believed that the present compositions deposit gold by a hybrid electroless plating process. As electrical current is unnecessary to plate gold using the present compositions, it is properly termed an electroless plating process. The present compositions do not plate gold onto gold foil, thus, the present compositions are not autocatalytic and thus are not believed to be a "true" electroless process. However, the present compositions provide gold deposits that are thicker than conventional immersion processes. For example, up to 175 pin of gold can be deposited on a nickel substrate after contact with the present compositions for 1 hour. Thus, the present plating process is believed to be a "hybrid" plating process.

The thickness of the desired gold deposit on a substrate can be controlled by controlling the amount of time the substrate is in contact with the present plating compositions. An advantage of the present compositions is that they provide gold deposits that have good adhesion.

The present compositions are particularly suited for depositing gold on a wide variety of substrates, particularly on a metal that is less electropositive than gold, i.e. a traditional immersion plating approach. Typical metals that are less electropositive than gold include, but are not limited to, nickel, copper, palladium and iron. More than one metal that is less electropositive than gold may be used. For example, a layer of palladium on a layer of nickel is a suitable substrate for depositing gold according to the present invention. Thus, the present invention further provides a method for depositing gold on a metal that is less electropositive than gold including contacting a substrate containing a metal that is less electropositive than gold with the composition described above.

The present compositions are also useful for plating depositing gold on a substrate using a "true" electroless process. For true electroless deposits, a conventional reducing agent is typically added to the present compositions. A wide variety of conventional reducing agents may be suitably employed. However, it is preferred that the present compositions do not contain thiourea, thiourea derivatives such as methylthiourea, dimethylthiourea, ethylthiourea, N-methylthiourea and the like, hydroquinone, catechol and the like. Such electroless deposits are achieved by contacting a substrate to be gold plated with the compositions described above.

The present compositions are particularly useful in the manufacture of electronic devices, such as printed wiring boards, integrated circuits and integrated circuit packaging. For example, in the manufacture of an electronic device including a gold layer, the gold layer can be deposited by a method including the step of contacting an electronic device substrate with a composition including: a) one or more water soluble gold compounds; b) one or more gold complexing agents; c) one or more organic stabilizer compounds of the formula R—SO$_2$—Y wherein R is (C$_1$–C$_{18}$)alkyl, aryl, or heteroaryl and Y is hydrogen or a monovalent cation; and d) and one or more uniformity enhancers; for a period of time sufficient to deposit the desired gold layer. Suitable metals that are less electropositive than gold are as described above and are preferably nickel and palladium on nickel. Such nickel and palladium layers are typically electrolessly deposited. Particularly suitable integrated circuit packaging include, but is not limited to, lead frames, pads on wafers, ceramic packages, and the like. The present invention is also suitable for applying a solderable gold finish on a printed circuit board or depositing gold on an integrated circuit.

The following examples are intended to illustrate further various aspects of the present invention, but are not intended to limit the scope of the invention in any aspect.

EXAMPLE 1

A gold plating solution was prepared by dissolving metallic gold (Au$^0$) in a mixture of hot hydrochloric acid and nitric acid. After the metallic gold was completely dissolved, the solution was heated to dryness. The remaining salt was than washed with hot deionized water and heated again until nitrates were no longer detectable in the solution, yielding HAuCl$_4$.

The HAuCl$_4$ obtained above was slowly added to the saturated solution of Na$_2$O$_3$S$_2$ until it would not go into solution, resulting in a milky solution at this point. Isopropyl alcohol was added until the solution cleared and a white precipitate started forming. The solution was left overnight for completion of the reaction. It was assumed that all gold was reduced from the auric to aurous state. The solution was filtered and the precipitate dried in the oven to provide AuNa$_3$O$_6$S$_4$.

EXAMPLE 2

A gold plating bath was prepared by combining the components in Table 1 in the amounts shown.

TABLE 1

| Component | Amount (g/L) |
| --- | --- |
| Gold as AuNa$_3$O$_6$S$_4$ | 1 |
| Sodium thiosulfate | 50 |
| Benzene sulfinic acid | 10 |
| Dihydrogen potassium phosphate | 15 |
| Oxalic acid | 5 |
| Water | To 1 L |

The pH of the bath was 5.5. The temperature of the bath was maintained at 120° F. (ca. 49° C.). A number of substrates were plated with gold by immersing the substrate, an FR-4 substrate containing a nickel layer, in the bath for 5 minutes. After removal from the bath, the substrates were rinsed and dried and the resulting gold deposits analyzed and found to be 4 to 7 μin thick.

EXAMPLE 3

An aluminum pad on a wafer was plated with nickel using a commercially available electroless nickel product (EVERON™ BP electroless nickel, available from the Shipley Company, Marlborough, Mass.). Standard plating conditions were used (190° F.) to deposit nickel at a rate of 12 μin/min. Following electroless nickel plating, the nickel coating was rinsed.

After rinsing, the nickel coated aluminum substrate was then contacted with the gold plating bath of Example 2. Gold was deposited on the nickel at a rate of approximately 2 μin/min. After gold plating, the substrate was removed from the plating bath, rinsed and dried.

EXAMPLE 4

The procedure of Example 3 was repeated except that the wafer pad was copper and the electroless nickel bath was operated at a temperature of 185° F. Nickel was deposited at a rate of 10 μin/min.

EXAMPLE 5

A gold plating bath was prepared according to Example 2, except that the amounts were those listed in Table 2.

TABLE 2

| Component | Amount (g/L) |
| --- | --- |
| Gold as AuNa$_3$O$_6$S$_4$ | 1 |
| Sodium thiosulfate | 55 |
| Benzene sulfinic acid | 10 |
| Dihydrogen potassium phosphate | 20 |
| Oxalic acid | 5 |
| Water | To 1 L |

The pH of the bath was 7. The temperature of the bath was maintained at 120° F. (ca. 49° C.).

EXAMPLE 6

Sixteen samples (ca. 1×2 inches) of FR-4 containing an electrolessly deposited nickel layer were plated with gold using the plating bath of Example 5. The thickness of the gold deposit on each sample was measured using X-ray fluorescence ("XRF") spectroscopy. Two measurements were taken for each sample. Most samples had a gold deposit having a thickness of 7–8 μm, with a mean value of 7.06 μin.

EXAMPLE 7

A sample (ca. 1×2 inches) of FR-4 containing an electrolessly deposited nickel layer was contacted with the plating bath of Example 5. After 30 minutes, the sample was removed from the plating bath and the thickness of the gold deposit was determined by XRF spectroscopy to be 78 μin.

EXAMPLE 8

A sample (ca. 1×2 inches) of FR-4 containing an electrolessly deposited nickel layer was contacted with the plating bath of Example 5. After 60 minutes, the sample was removed from the plating bath and the thickness of the gold deposit was determined by XRF spectroscopy to be 173 μin.

EXAMPLE 9

Samples (ca. 1×2 inches) of FR-4 containing an electrolessly deposited nickel layer and a gold layer (7–9 μin) deposited according to Example 2 were evaluated for their wire bonding ability. Aluminum wire (1 mil) was ultrasonically bonded to the gold layer on a number of samples using a K&S model 4523 aluminum wire bonder. Gold wire (1.3 mil) was thermosonically bonded to the gold layer on a number of samples using a K&S model 4524 gold wire bonder. Some of both the aluminum and gold wire bonded samples were pulled as is. Some samples were baked for 1 hour at 150° C. before pulling. Some samples were baked (1 hour, 150° C.) first, then bonded to either aluminum or gold wire and then pulled. The force needed to break the wire is reported in grams (g). The results are reported in Table 3.

TABLE 4

| Wire | Bonded and Pulled (g) | Bonded, Baked and Pulled (g) | Baked, Bonded and Pulled (g) |
|---|---|---|---|
| Aluminum | 8.5–8.6 | 8.5–8.6 | 8–8.1 |
| Gold | 11.5–12 | 13–13.5 | 11–11.5 |

EXAMPLE 10

The procedure of Example 9 was repeated except that the samples contained an electroless nickel layer, an electroless palladium over nickel and then gold over palladium. Acceptable aluminum and gold wire bonding results were obtained.

EXAMPLE 11

Ten samples (ca. 1×2 inches) of FR-4 containing an electrolessly deposited nickel layer and a gold layer (7–9 μin) deposited according to Example 2 were evaluated for the solderability of the gold deposit. Solderability was evaluated using a MENISCO ST-50 wetting balance. Five samples were tested as gold plated and the other five samples were tested after baking at 16 hours at 150° C. Lead-free solder was used at 245° C. The flux used was KESTER 422-CX no clean type. For each sample, the zero cross time (in seconds) and the wetting force at 2 seconds (in mN/mm) were determined. Two measurements were made on each sample and the averages were reported. The results are reported in Table 4.

TABLE 4

| Samples | Zero Cross Time (sec) | Wetting Force at 2 seconds (mN/mm) |
|---|---|---|
| As plated | 0.15 | 0.26 |
| After Baking | 0.25 | 0.28 |

What is claimed is:

1. An electroless gold plating composition comprising:
   a) one or more water soluble gold compounds;
   b) one or more gold complexing agents;
   c) one or more organic stabilizer compounds of the formula R—SO$_2$—Y wherein R is (C$_1$-C$_{18}$)alkyl, aryl, or heteroaryl and Y is hydrogen or a monovalent cation; and
   d) one or more uniformity enhancers.

2. The composition of claim 1 wherein the gold compound is an alkali metal gold thiosulfate compound.

3. The composition of claim 1 wherein the one or more water soluble gold compounds are present in an amount of 0.1 to 60 g/L.

4. The composition of claim 3 wherein the one or more water soluble gold compounds are present in an amount of 0.5 to 15 g/L.

5. The composition of claim 1 wherein R is phenyl, tolyl, xylyl, naphthyl, or bisphenol A.

6. The composition of claim 1 wherein Y is hydrogen or sodium.

7. The composition of claim 1 wherein the one or more organic stabilizer compounds are present in an amount of at least 2 g/L.

8. The composition of claim 1 wherein the gold complexing agent is a thiosulfate salt.

9. The composition of claim 1 wherein the one or more uniformity enhancers are selected from the group consisting of oxalic acid, ascorbic acid, citric acid, malic acid, glycolic acid, malonic acid, lactic acid, oxalactic acid, tartaric acid, phthalic acid, adipic acid, succinic acid and glutaric acid.

10. The composition of claim 1 wherein the uniformity enhancer is oxalic acid.

11. The composition of claim 1 wherein the uniformity enhancer is present in an amount of 0.1 to 50 g/L.

12. The composition of claim 11 wherein the uniformity enhancer is present in an amount of 1 to 15 g/L.

13. The composition of claim 1 wherein the composition is substantially free of cyanide ion and sulfite ion.

14. An electroless gold plating composition consisting essentially of:
   a) one or more water soluble gold compounds;
   b) one or more gold complexing agents;
   c) one or more organic stabilizer compounds of the formula R—SO$_2$—Y wherein R is (C$_1$-C$_{18}$)alkyl, aryl, or heteroaryl and Y is hydrogen or a monovalent cation; and
   d) one or more uniformity enhancers.

15. An electroless gold plating composition consisting essentially of:
   a) one or more water soluble gold compounds;
   b) one or more gold complexing agents selected from the group consisting of thiosulfuric acid or an alkali metal thiosulfate salt;
   c) one or more organic stabilizer compounds of the formula R—SO$_2$—Y wherein R is (C$_1$-C$_{18}$)alkyl, aryl, or heteroaryl and Y is hydrogen or a monovalent cation; and
   d) oxalic acid.

16. A method of electrolessly depositing gold on a substrate comprising the step of contacting a substrate with the composition of claim 1.

17. A method pf depositing gold on a metal that is less electropositive than gold comprising contacting a substrate containing a metal that is less electropositive than gold with the composition of claim 1.

18. A method of manufacturing an electronic device comprising depositing a gold layer comprising the step of contacting an electronic device substrate with a composition comprising:
   a) one or more water soluble gold compounds;
   b) one or more gold complexing agents;
   c) one or more organic stabilizer compounds of the formula R—SO$_2$—Y wherein R is (C$_1$-C$_{18}$)alkyl, aryl, or heteroaryl and Y is hydrogen or a monovalent cation; and
   d) and one or more carboxylic acid uniformity enhancers; for a period of time sufficient to deposit the desired gold layer.

19. The method of claim 18 wherein the electronic device substrate comprises a metal that is less electropositive than gold.

20. The method of claim 18 wherein the electronic device substrate is selected from the group consisting of printed wiring board substrates, integrated circuits, lead frames, pads on wafers and ceramic packages.

* * * * *